United States Patent [19]

DeMeuse et al.

[11] Patent Number: 5,453,161
[45] Date of Patent: Sep. 26, 1995

[54] POLYAMIC ACID TO POLYIMIDE CONVERSION BY MICROWAVE HEATING

[75] Inventors: Mark DeMeuse, Robbinsville, N.J.; Ernesto Occhiello, Novara, Italy

[73] Assignee: Enichem S.p.A., Milan, Italy

[21] Appl. No.: 151,216

[22] Filed: Nov. 12, 1993

[51] Int. Cl.[6] ........................................ C25B 3/00
[52] U.S. Cl. .................. 204/157.71; 204/157.81; 204/157.89
[58] Field of Search ............... 204/157.6, 157.71, 204/157.81, 157.89

[56] References Cited

U.S. PATENT DOCUMENTS

| | | | |
|---|---|---|---|
| 4,599,365 | 7/1986 | Gagliani et al. | 521/56 |
| 4,855,231 | 8/1989 | Lanier et al. | 521/184 |
| 4,877,563 | 10/1989 | Broemmelsiek et al. | 264/26 |
| 4,892,896 | 1/1990 | Wright | 523/300 |
| 4,897,432 | 1/1990 | Lee et al. | 521/184 |
| 4,900,762 | 2/1990 | Broemmelsiek et al. | 521/184 |

OTHER PUBLICATIONS

Lewis et al. "Accelerated Imidization Reactions Using Microwave Radiation", Journal of Polymer Science, Part A: Polymer Chemistry, vol. 30, 1647–1653 (no month) (1992).
*Thermal Solution Reactions,* Cure Kinetics and Mechanical Behavior of Electromagnetically Processed Polyimides, Lewis et al, pp. 174–175. (no date).

*Primary Examiner*—John Niebling
*Assistant Examiner*—Edna Wong
*Attorney, Agent, or Firm*—Oblon, Spivak, McClelland, Maier, & Neustadt

[57] ABSTRACT

An intermolecular and/or intramolecular non-foamed polyimide is prepared by heating an aromatic tetracarboxylic acid or dianhydride thereof and an aromatic diamine thereby preparing a polyamic acid, and then subjecting the polyamic acid in the solid phase in the absence of solvent to focused microwave radiation, thereby preparing the polyimide product.

8 Claims, 3 Drawing Sheets

POLYAMIC ACID TO POLYIMIDE CONVERSION BY MICROWAVE HEATING

BACKGROUND OF THE INVENTION

1. Field of the Invention

The present invention relates to a method of converting a polyamic acid to a polyimide by treatment with microwave energy. More particularly, the invention relates to the conversion of polyamic acid to a non-foamed polyimide in the absence of a solvent by subjecting the polyamic acid to focused microwave radiation.

2. Description of the Background

Polyimides are an important class of high-performance polymers which have applications as composites in the aerospace industry and as high temperature coatings in the electronics industry. A problem with polyimide preparation is the difficulty of processing the precursor polyamic acids to guarantee complete conversion to the corresponding polyimides. This problem has limited the widespread use of these materials. Factors which are known to be responsible for these processing problems include poor solubility in common solvents, evolution of volatiles during heat treatment and void formation. (K. L. Mitta, "Polyimides, Syntheses, Characterizations, and Applications", Plenum, New York, 1984, volumes I and II; M. I. Besonov, M. M. Koton, V. V. Kudryavtsev and L. A. Laius, "Polyimides, Thermally Stable Polymers", Consultants Bureau, New York, 1987). A most significant problem, however, is the long time and high temperatures which are required to obtain complete conversion of the polyamic acid to polyimide, according to the reaction scheme shown in FIG. 1. (A. K. St. Clair and T. L. St. Clair, ACS Symposium Series No. 346, M. J. Bowden and S. R. Turner, ed, p. 437 (1987)).

Several studies in the literature (J. A. Krevz, A. O. Endrey, F. P. Gay and C. E. Sroog,, J. Polym. Sci., Part A-1 (1966), 2067; S. V. Lavrov, I. E. Kardash and A. N. Pravednikov, Polym. Sci., USSR (1977), 19, 2727; S. V. Lavrov, A. Y. Ardashnikov, I. E. Kardash and A. N. Pravednikov, Polym. Sci., USSR (1977), 19, 1212; E. Pyun, R. J. Mathisen and C. S. P. Sung, Macromolecules (1989), 22, 1174) have attempted to define the essential features of the imidization mechanisms and kinetics. However, these previous studies, especially the solution studies, have often been either contradictory or incomplete. This has often led to an adoption of complex, empirically established, multi-stage processing schemes with a limited amount of scientific understanding.

An area of technology which is known is the preparation of foamed and fully cured polyimide resins by the application of microwave energy. Gagliani et al, U.S. Pat. No. 4,599,365, describes the preparation of foamable polyimide resins by esterifying a dianhydride, reacting the product with a diamine, drying the resulting product and heating this product to spontaneously form a foam. Complete foaming and curing of the polyimide is achieved by incorporating an oxoimine in the polyamic acid. Lanier et at, U.S. Pat. No. 4,855,231, shows the preparation of a polyimide foam by raising the temperature of at least the lower portion of a body of polyimide precursor to a temperature within the range of 50° to about 200° C. and commencing the exposure of the body of the polyimide precursor to microwave radiation of an intensity sufficient to cause development of a foamed polymer structure. The body of the polyimide precursor and of the foamed structure, as it develops therefrom, is maintained under a substantially vapor-impermeable microwave compatible shroud that does not impede the development of the foamed structure. Broemmelsiek et al, U.S. Pat. Nos. 4,877,563 and 4,900,762, show a method of preparing a foamed polyimide by subjecting a polyimide precursor to microwave radiation directed to the body of the precursor from the top, sides and ends thereof. The method avoids curtailment of radiation such that it is not directed upwardly into the precursor or developing foam. A preferred method of curtailment involves maintaining a microwave radiation curtailing shield between the precursor body and the source of microwave radiation therebelow. Wright, U.S. Pat. No. 4,892,896, discloses a process for transforming a normally non-flowable resinous semi-solid or viscous liquid polyimide precursor into a flowable liquid. The precursor composition is subjected to microwave radiation of an intensity sufficient to convert at least a portion of this composition into a flowable liquid without causing a significant change in the chemical composition of the precursor composition. Finally, Lee et al, U.S. Pat. No. 4,897,432, discloses a method of improving the yields of polyimide foam by keeping a body of a polyimide precursor under a substantially vapor-impermeable microwave-compatible shroud, before and during the time the body of polyimide precursor is exposed to microwave radiation, so that development of a foamed structure is not substantially restricted or impeded. These methods of the prior art are essentially directed to the preparation of polyimide foams in a microwave oven. Further, the microwave power levels employed are much higher than the 40 W maximum level of the present process.

Recently, microwaves as a heating source for the imidization reaction has been suggested for decreasing the reaction time of the polyamic acids. (D. A. Lewis, J. D. Summers, T. C. Ward and J. E. McGrath, Accelerated Imidization Reactions Using Microwave Radiation, Polymer Preprints, 29(1), 174 (1988)). This work is based upon the reaction between 3,3',4,4'-benzophenone tetracarboxylic acid dianhydride (BTDA) and 3,3'-diaminodiphenylsulfone (3,3' DDS) in solution. Here the reaction times are reduced by a factor of 20 to 40 when using microwaves, depending upon the reaction temperature. No mention of performing the reaction in the solid state is disclosed in the publication. In similar work by L. A. Fellows and M. C. Hawley of Michigan State University, a polyamic acid (LARC-TPI) formed from 3,3'-DDS and BTDA is subjected to microwave radiation in a diglyme solution. No mention is given of reduced reaction times and, of course, the reaction is conducted in solution and not in the solid phase.

An interesting result from this work is the determination that the activation energy of the microwave-induced reaction was about 57 kJ/mole and of the thermal process 105 kJ/mole. It has been proposed that the observed decrease of activation energy is due to the fact that the reacting groups in the reaction are "hotter" than the bulk, because of higher "local" vibrational and rotational energy levels in the reacting molecules in comparison with neighboring groups. The temperature difference due to preferential absorption of the microwaves by the acid and amine groups is evaluated to be around 50–60° K. However, no direction is given in said publication, about a process for obtaining a solid polyimide under treatment with microwaves which is free of voids, homogeneous and endowed with a satisfying combination of mechanical, thermal and electrical properties.

A need continues to exist for the development of a polyamic acid to polyimide technique which is effective for achieving a solid non-foamed plastic material and which can be accomplished by the application of microwave energy.

SUMMARY OF THE INVENTION

Accordingly, one object of the present invention is to provide a method of converting polyamic acid precursor to non-foamed intermolecular and intramolecular polyimide by subjecting the polyamic acid precursor to focused microwave radiation.

Briefly, this object and other objects of the present invention as hereinafter will become more readily apparent, can be attained in a method of preparing a non-foamed, intermolecular and/or intramolecular polyimide by heating an aromatic tetracarboxylic acid or a derivative thereof and an aromatic diamine thereby preparing a polyamic acid, and thereafter subjecting said polyamic acid in the solid phase in the absence of solvent to focused preferably monomodal, microwave radiation, thereby preparing the polyimide product.

DETAILED DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

Figure 1:
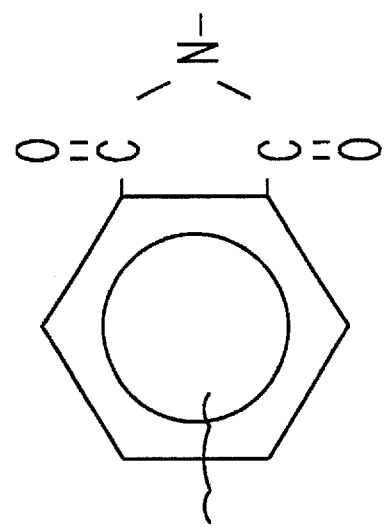
FIG. 1 is an equation showing the conversion of polyamic acid to polyimide.
Figure 1:
Figure 1:
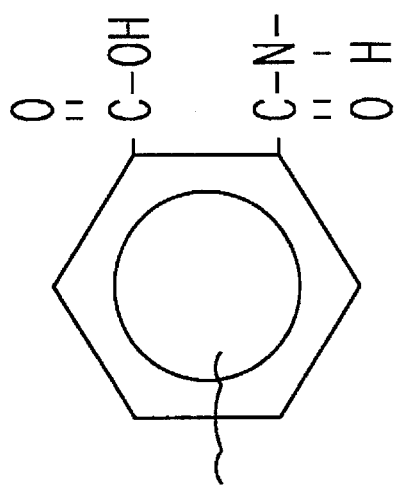

The discovery of the present invention is an improved polyamic acid to polyimide conversion method which is accomplished by subjecting a polyamic acid to focused or tunable microwave radiation in the solid phase without the presence of solvent. The polyamic acid is prepared by reacting an aromatic tetracarboxylic acid or a corresponding aromatic dianhydride with an aromatic diamine. Suitable aromatic tetracarboxylic acids include those having the formula:

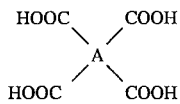

wherein A is a tetravalent organic aromatic group. The tetravalent group A preferably has one of the following structures:

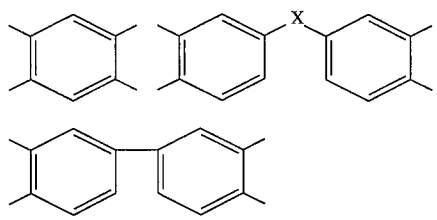

wherein X is one or more of the following:

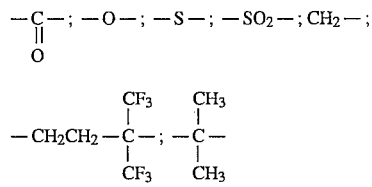

Preferred derivatives of aromatic tetracarboxylic acids which may be employed include the anhydrides and alkyl esters thereof. Among the esters, those otained with lower alcohols are most preferred. Mixtures of two or more aromatic esters, preferably the diesters, may also be employed. Particularly preferred are the anhydride and the lower alkyl esters of 3,3', 4,4'-benzophenone tetracarboxylic acid.

In a variant of the present invention, the tetracarboxylic acid derivative may be obtained by reaction thereof with a caprolactam as taught by U.S. Pat. Nos. 4,161,477, 4,183,838 and 4,183,839, the disclosures of which are incorporated herein by reference. As described in these patents, bisimide is formed by reaction of a tetracarboxylic acid dianhydride with an oxoimine such as caprolactam and then reacted with the diamine or diamines to produce the desired polyimides. The caprolactam is displaced during the reaction, in much the same way as is the ester portion of the tetracarboxylic acid ester.

The tetracarboxylic acid derivative may also be an N-substituted imido acid ester of the tetracarboxylic acid as taught by U.S. Pat. Nos. 4,647,597 and 4,656,198, the disclosures of which are incorporated herein by reference. As described in these patents, the N-substituted imido acid ester may be formed by reacting an aromatic tetracarboxylic acid dianhydride with an amino acid and an alcohol or mixture of alcohols. As further taught in those patents, on reaction of the imido acid ester with the diamine or diamines, the acid ester group bonded to the nitrogen atom of the N-substituted imido acid ester is displaced so that the desired polyimide is formed.

Suitable diamine reactants for the tetracarboxylic acid reactant include those represented by the formula:

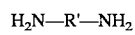

wherein R' is an aromatic group containing 5 to 16 carbon atoms and containing up to one hetero atom in the ring, the hetero atom being nitrogen, oxygen or sulfur. Also included are aromatic groups such as:

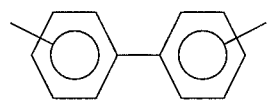

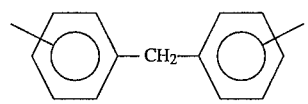

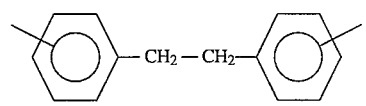

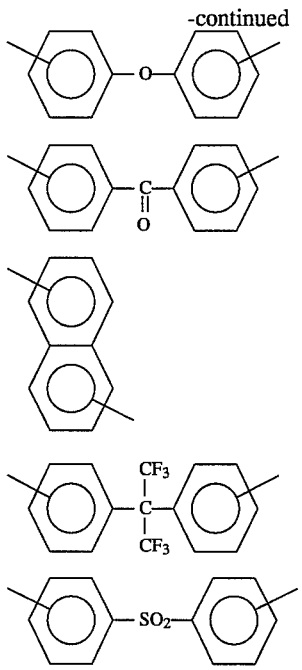

Representatives of such diamines include 2,6-diaminopyridine; 3,5-diaminopyridine; 3,3'diaminodiphenylsulfone; 4,4'-diaminodiphenylsulfone; 4,4'-diaminodiphenylsulfide; 3,3'-diaminodiphenylether; 4,4'-diaminodiphenylether; meta-phenylenediamine; para-phenylenediamine; 4,4'-methylene dianiline; 2,6-diamino toluene; 2,4-diaminotoluene and the like.

It is also possible and sometimes desirable in the preparation of the polyimide precursors of this invention, to include in the reaction mixture one or more aliphatic diamines. Such aliphatic diamines are preferably alpha, omega diaminoalkanes having the formula:

wherein n is an integer from 2 to 16. Representatives of such diamines include 1,3-diaminopropane, 1,4-diaminobutane, 1,5-diaminopentane, 1,6-diaminohexane, etc.

In place of or in addition to the foregoing aliphatic amines, use can be made of aliphatic etherified polyamines of the type polyoxypropylene amines having the formula:

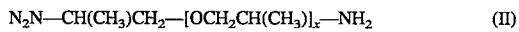

wherein x varies from 1 to about 5.

Other useful primary diamines which may be included in the products of this invention include amino-terminated butadiene-nitrile copolymers having the general formula:

wherein R is either a phenylene group or an alkylene group, $R_1$ is hydrogen or methyl, and x and y are each independently integers ranging from 1 to 25 and n is an integer, preferably below 20. In these copolymers it is preferred that butadiene constitute at least 50% by weight of the butadiene and nitrile monomer. The nitrile monomer copolymerized with the butadiene can either be acrylonitrile or methacrylonitrile. Such copolymers generally have low molecular weights, preferably less than 3,000 to insure that they are sufficiently fluid to react in the formation of the polyimide.

Still another type of primary diamine which may be included in the products of this invention is the aromatic amino-terminated silicones, such as those having the general formula:

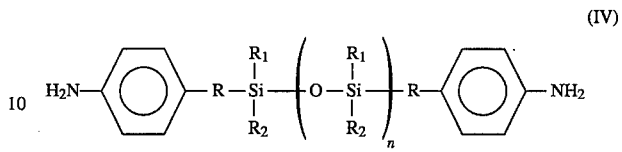

wherein R is a $C_2$ to $C_6$ alkylene group, $R_1$ and $R_2$ are each independently lower alkyl containing 1 to 3 carbon atoms and n is an integer from 1 to 4.

Another preferred category of diamines which may be utilized in the present invention are the diesters of an amino-substituted aromatic carboxylic acid and a polymethylene glycol. Such diesters may be represented by the general formula:

wherein R is an alkylene group (which may be branched or straight chain) and which preferably contains from 3 to 8 carbon atoms, most preferably trimethylene; and Ar is an aromatic group which may be composed of one or more fused or non-fused benzene rings which in turn may carry suitable substituents (e.g., nitro, alkoxy, etc.) in addition to the primary amino groups.

A few exemplary diesters of this type include: ethylene glycol-4-aminobenzoic acid diester; ethylene glycol-3-aminobenzoic acid diester; ethylene glycol-2-aminobenzoic acid diester; trimethylene glycol-3-aminobenzoic acid diester; trimethylene glycol-2-aminobenzoic acid diester; trimethylene glycol-3-amino-2-nitrobenzoic acid diester; tetramethylene glycol-3-amino-5-nitrobenzoic acid diester; tetramethylene glycol-4-amino-2-nitrobenzoic acid diester; -5-pentanediol-4-amino-3-nitrobenzoic acid diester; -6-hexanediol-5-amino-2-nitrobenzoic acid diester; neopentyl glycol-4-amino-2-methylbenzoic acid diester; 1,8-octanediol-4-amino-2-propylbenzoic acid diester; 1,9-nonanediol-3-amino-4-methylbenzoic acid diester; 1,10-decanediol-4-(4-aminophenyl)benzoic acid diester and the like. Mixtures of such diesters may be employed.

A particularly preferred diester of this type is the diester of trimethylene glycol (1,3-propanediol) and 4-aminobenzoic acid.

The polyamic acid can be prepared by any known or conventional technique such as by reaction of the tetracarboxylic acid (dianhydride) and diamine reactants in a solvent at room or elevated temperature. Generally, the reaction is carried out at temperatures lower than 100° C., preferably lower than 50° C. For best results, suitable solvents for these compositions should contain from 10 to 100% by weight of one or more dipolar aprotic solvents, preferably dimethylformamide, dimethylacetamide, N-methylpyrrolidone, diglyme, dimethylsulfoxide, or the like. Other solvents which may be used include ethers such as tetrahydrofuran, tetrahydropyran, and the like; chlorohydrocarbons such as methylene chloride, and the like, ketones such as acetone, methylethyl ketone, and the like; alcohols such as methanol, ethanol, propanol, isopropanol, and the like. The tetracarboxylic acid and diamine reactants are reacted in about equimolar ratios to form the polyamic acid product. The optional solvent used in the preparation of the polyamic acid is removed before the conversion of the latter to polyimide, according to one of the methods commonly known in the art such as evaporation, filtration, extraction, or the like.

In the polyamic acid to intermolecular and intramolecular polyimide conversion method of the invention, a polyamic acid in the form of a solid material such as a film in the absence of solvent is subjected to microwave energy in a tunable cavity, preferably a single mode operated cavity, of a microwave device. The microwave device of the present invention is a low power device having a maximum output power of 40 watts. The frequency range for the microwave device ranges from $10^8$ to $10^{11}$ Hz. Typical exposure times are 1–60 minutes or the time necessary to achieve full cure.

The solid body of polyamic acid subjected to microwave radiation can be of most any shape including films which are preferred. Film thicknesses should range from 0.01 mm to 5 mm, preferably 0.01 to 0.1 mm.

Microwave devices having single-mode, tunable cavities have recently been developed as described by J. Jow et al, Rev. Sci. Instrum., 60, 96 (1989). The tunable cavity of such devices permits the generation of higher efficiency microwave power. Heating has been observed in systems where a conventional microwave oven yields significantly less heating (M. DeMeuse, Polym. Mater. Eng., 66, 428 (1992)).

An important feature of the single-mode applicator is its ability to focus and match the incident microwave energy into the material being processed. The single-mode cavity applicator offers a distinct advantage over multimode cavities in that the impedance mismatch between the external circuit and the cavity due to changes of dielectric properties of the loaded material during processing can be avoided by tuning the applicator. This is accomplished through either adjustment of a continuously variable probe or the cavity end plate. Through this approach, the ratio of the power absorbed by the sample and the cavity to the incident powder is generally greater than 98 percent. This high efficiency is attributed to the continuous tuning of the cavity length and the coupling probe depth to maintain the resonance between the sample-loaded cavity and the external circuit during processing.

The microwave conversion method of the present process produces a polyimide product which is not a foamed product and which is cured at temperatures below 250° C., preferably below 200° C. The final polyimide product of the present invention has a glass transition temperature (Tg) of greater than 200, a high modulus and a low dielectric constant.

A preferred aspect of the present invention is the preparation of three polyamic acids from the same acid with different diamine reactants. That is, 3,3',4,4'benzophenone tetracarboxylic acid dianhydride (BTDA) is reacted with each one of three diamines which are 3,3'diaminobenzophenone (3,3'-DABP) (Polyamic acid designated LARC-PAA), 4,4'-diaminodiphenylsulfone (4,4'-DDS) (Polyamic acid designated PISO2-PAA) and 3,3'-diaminodiphenylsulfone (3,3'-DDS) (Polyamic acid designated m-PISO2-PAA).

The polyimides produced by the present invention exhibit an excellent combination of thermal, mechanical, and electrical properties. Specifically, the glass transition temperature of these materials is typically in excess of 200° C. They display high impact properties, tensile strength, and dimensional stability. The materials perform extremely well under cryogenic conditions. Polyimides are inherently combustion-resistant. Applications for polyimides include: films for electric motors, various aircraft/aerospace uses (engine components, insulation for wire and cable, bearings), chip carriers for integrated circuits, printed wiring boards, and as coatings and adhesives.

Having now generally described the invention, a further understanding can be obtained by reference to certain specific examples which are provided herein for purposes of illustration only and are not intended to be limiting unless otherwise specified.

EXPERIMENTAL PROCEDURE 3,3',4,4'-Benzophenone tetracarboxylic acid dianhydride (BTDA) is obtained from Janssen Chimica (purity=96%) and is purified by sublimation before use (purity=98%). N,N'-dimethylacetamide (DMAc), Rudipont reagent grade, is distilled from phosphorus pentoxide under reduced pressure. Several diamines and solvents are obtained and are (i) 3,3'-diaminobenzophenone (3,3'-DABP), K & K Laboratories (purity =97%) (ii) 4,4'-diaminodiphenylsulfone (4,4'-DDS), Fluka (purity=96%) (iii) 3,3'-diaminodiphenylsulfone (3,3'-DDS), Janssen Chimica (purity=97%) (iv) 3,3'-diaminodiphenylmethane (3,3'-MDA), Fairfield Chemical Co. (purity=99.2%) and (v) bis(2-methoxyethyl) ether (diglyme), Fluka.

The polyamic acids are prepared at a solids concentration of about 20% (w/w) by the reaction of a stoichiometric amount of BTDA to a stirred solution of the diamine in diglyme (or DMAc) under a nitrogen atmosphere at room temperature. The polyamic acid solutions are stirred for 8–24 hours at room temperature under nitrogen. The polymer solutions are stored at −20° C. until required for use.

Films of the polyamic acids are prepared by casting each polyamic acid solution onto glass plates and drying under nitrogen at room temperature. The thicknesses of the films obtained range from 0.02–0.04 mm.

Microwave experiments are conducted on each of the prepared films utilizing a 7-inch diameter single-mode resonant, tunable cavity. The microwave unit consists of a variable power unit which operates at a frequency of 2.45 GHz, with a maximum output power of 40 watts and a programmable temperature controller. Temperature is monitored using a Luxtron 755 fluoroptic system. The temperature probe is placed directly on the surface of the film during the microwave experiments. This is very important so that the temperatures which are reported for the microwave experiments are the actual sample temperatures.

In the microwave heating experiments, the polyamic acid film samples are either heated by themselves in the microwave cavity or on a polycarbonate substrate. In order to guarantee uniform reaction profiles, as well as uniform temperatures within the samples, small circular disks are taken from the films using the same apparatus used for the DSC experiments which are described infra. It has been experimentally observed that the heating rate of the polyamic acid under microwave radiation suprisingly increases at temperatures above about 100° C.

Thus, in a preferred embodiment of the present invention, the polyamic acid is heated by means of any conventional heating method, or by means of a combination of microwave treatment and a conventional heating method, up to about 100° C., and then a focused single mode microwave treatment is applied thus obtaining a rapid conversion to a non-foamed polyimide. In the following examples, polyamic acid supported on polycarbonate is used with typical heating times in the order of 1.5–2 minutes. This is important because substantial reaction can occur in the time period involved with heating to the desired isothermal temperature. All microwave experiments are done isothermally. Temperature is maintained by pulsing the microwave power by means of a controlled loop feedback sequence. Typical temperature variations are ±4° C. Temperature is recorded every seven seconds during the isothermal experiments and the reported isothermal temperatures correspond to an average of all of the measured values.

Similar time and temperature profiles are obtained in a conventional thermal experiment using a Perkin-Elmer 7 Differential Scanning Calorimeter (DSC). The reported temperatures are the ones for which the DSC is programmed. The heating rate which is used to heat to the isothermal reaction temperature is adjusted to correspond to the heating rate used in the microwave experiments. Isothermal reaction experiments are performed at the various reaction temperatures for times ranging from 1 to 60 minutes. After the isothermal experiments, the various samples are removed from either the microwave cavity or DSC and ground with potassium bromide (KBr) and made into a pellet for infrared (IR) analysis.

The FT-IR experiments are performed using a Mattson Cygnus spectrometer. Typically, experiments are done using 64 scans with a resolution of 2 $cm^{-1}$. A fresh sample of material is used for each experiment.

DATA ANALYSIS

The IR analysis consists of monitoring the amic acid peak at about 1540 $cm^{-1}$ as a function of reaction time. The exact peak position depends on the polyamic acid being used. Its change is referenced relative to a reference peak at about 1500 $cm^{-1}$, which is attributed to the ring breathing modes of the aromatic moieties (L. V. Bellamy, "Infrared Spectra of Complex Molecules", 3rd ed Chapman and Hall, London, 1975, p. 79). The fraction (X) of polyamic acid which has reacted is calculated according to the equation:

$$X = 1 - \frac{(A_A/A_{REF})}{(A_A/A_{REF})_o} \quad (1)$$

where $A_A$ is the net absorbance (or area) of the peak at 1540 $cm^{-1}$ at time t and $A_{REF}$ is the absorbance (or area) of the peak at about 1500 $cm^{-1}$. (o in the denominator corresponds to time zero, or the unreacted sample). The reference peak is used to account for differences in the concentration of sample in the pellet. For consistency purposes, both the net absorbance and peak areas are used in calculating the fraction of converted polyamic acid.

Since the experiments are done for various times, eventually conversion versus time plots are obtained. It is generally assumed in the literature that the imidization reaction follows first-order kinetics; this is because it only involves one molecule reacting with itself. The first-order kinetic rate law for describing the variation of conversion, x, with time t is $$X = 1 - \exp(-kt) \quad (2)$$

where k is the rate constant for reaction. Equating (1) and (2) and taking the logarithm of both sides produces $$Ln(A_A/A_{REF}) = Ln(A_A/A_{REF})_o - kt \quad (3)$$

This equation implies that a plot of $Ln(A_A/A_{REF})$ vs. t is a straight line with the y-intercept given by $Ln(A_A/A_{REF})_o$, slope by $-k$. It is possible to use the various k values to quantitatively determine the effect that microwaves have on the reaction rate. Further, by assuming that the rate constants obey an Arrhenius relation, it is possible to calculate a value for the activation energy for reaction and compare the microwave and thermal values. The same value in the two cases would indicate that the reaction is proceeding via the same reaction mechanism, while different activation energy values indicate that a different reaction pathway is being followed in the microwave and thermal cases.

EXAMPLE 1

Figure 2:
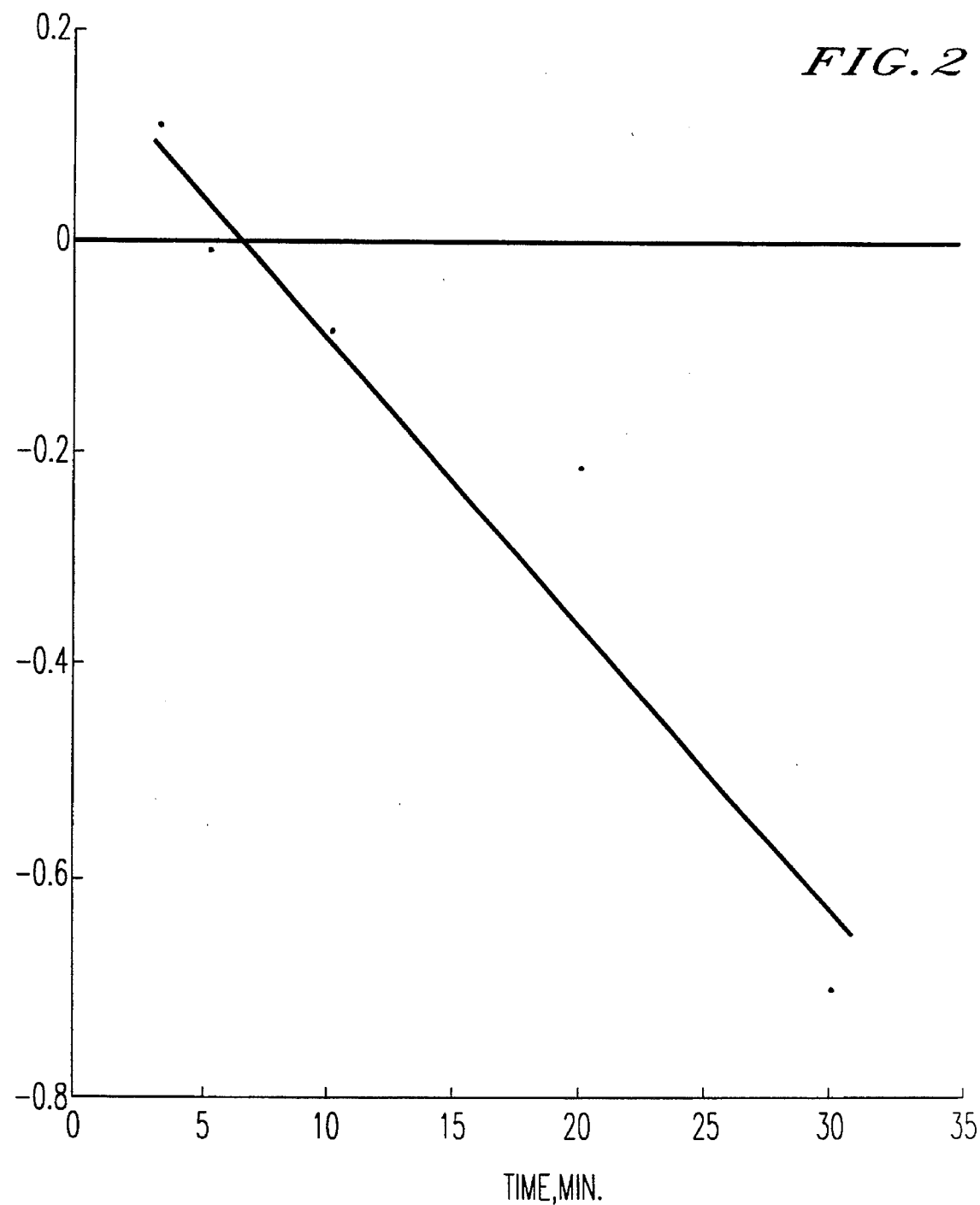
FIG. 2 is a graph showing the determination of the rate constant for a polyamic acid prepared from BTDA and 3,3'-DABP which is heated in a microwave cavity.
Figure 3:
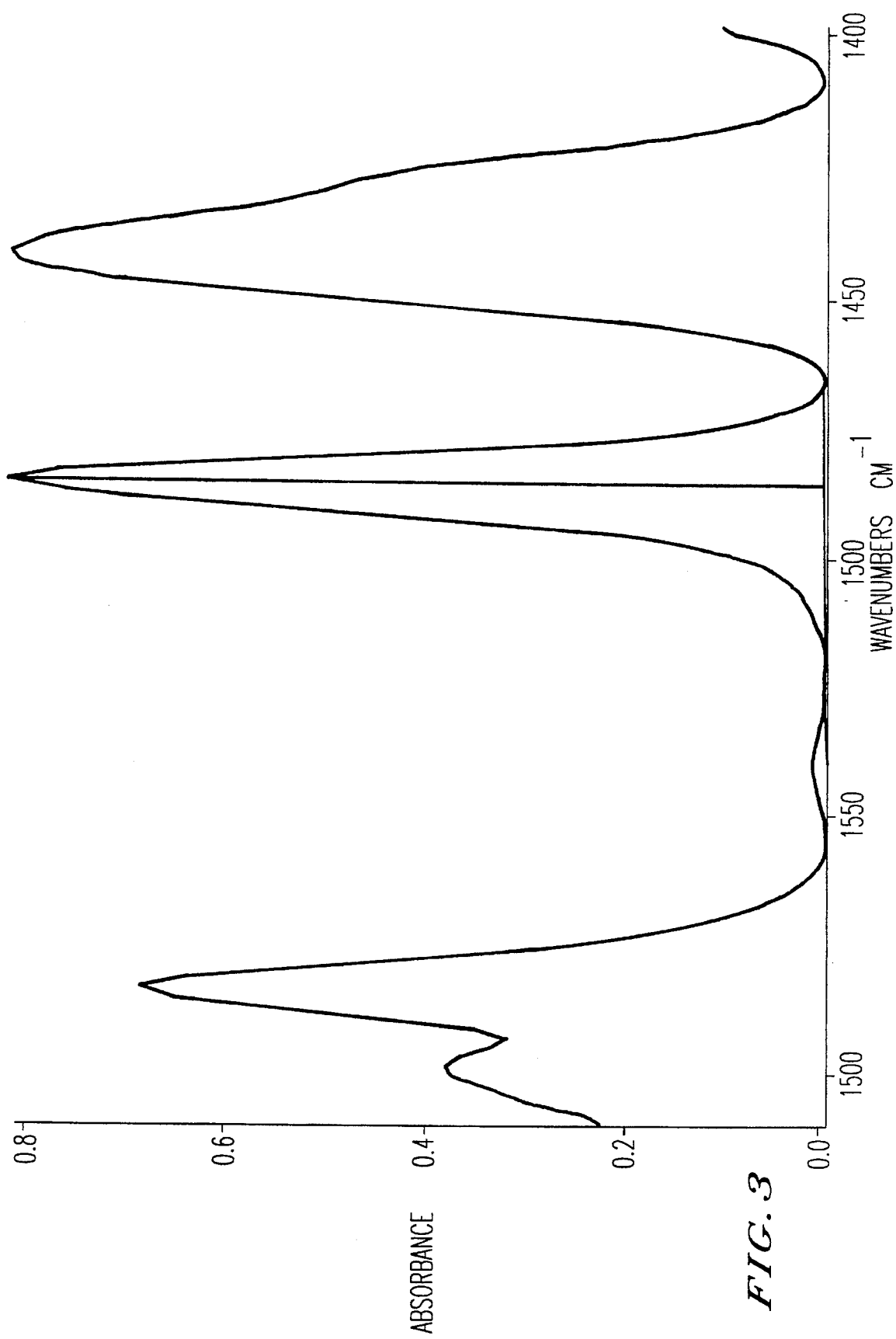
FIG. 3 is a partial infrared spectrum of an imidized film of LARC-PAA over the wavelength region of 1450–1600 $cm^{-1}$.

FIG. 2 contains the indicated analysis for the polyamic acid based on BTDA and 3,3'-DABP which is reacted in the microwave cavity at a bulk temperature of 140° C. The analysis in FIG. 3 shows that the IR data for the disappearance of the polyamic acid clearly follows first-order kinetics for the time-scale examined. The rate constant is extracted from the slope of these straight line plots.

Table 1 contains a summary of the rate constants obtained for the polyamic acid based on BTDA and 3,3'-DABP both in the microwave cavity and in the DSC. Note that slightly different temperature ranges are shown in the microwave and DSC cases. These different ranges result from the fact that at the same temperature (160°–170° C.), where in the DSC the rate constants are reasonable, using the microwaves the reaction is too rapid to follow. In other words, at these temperatures, using microwaves as the heating source, in one minute time at temperature, the reaction is nearly complete. For reaction times less than that, it is very difficult to distinguish between the reaction which occurs during the heat-up time to temperature and the reaction at the isothermal temperature itself.

TABLE 1

Reaction Rate Constants for Polyamic Acid Based on BTDA and 3,3' DABP

| DSC Data | | Microwave Data | |
|---|---|---|---|
| T (C.) | k (min$^{-1}$) | T (C.) | k (min$^{-1}$) |
| 140 | 0.0091 | 106 | 0.0037 |
| 160 | 0.016 | 128 | 0.0071 |
| 170 | 0.051 | 136 | 0.022 |
| Ea = 19.3 kcal/mole | | Ea = 16.6 kcal/mole | |

Table 1 shows that at an isothermal temperature of 140° C. the microwave reaction rate constant is about 2.4 times larger than the thermal rate constant; and moreover, the activation energy obtained with the microwaves is lower than the corresponding thermal one. This clearly shows that in this case, at this temperature, microwaves enhance the reaction rate.

Two other polyamic acids are examined in this study. The first polyamic acid (designated PISO2) is made from BTDA and 4,4'-DDS. The second polyamic acid (designated m-PISO2) is also based on BTDA but the diamine reactant is 3,3'-DDS. An examination of these two polyamic acids not only provides further details concerning the effect of using different diamines with BTDA, but also provides insight concerning the effect of using different isomers of diamines.

The same type of experiments as explained above are also done on these two polyamic acids. Table 2 contains a summary of the rate constant data obtained for PISO2, as well as the data obtained for m-PISO2, at a bulk temperature of 150° C., both in the DSC and the microwave experiments. These rare constant values are obtained using exactly the same analysis, as done above for the first polyamic acid sample.

TABLE 2

Reaction Rate Constants for PISO2 and m-PISO2

| DSC Data | | Microwave Data | |
|---|---|---|---|
| T (C.) | k (min$^{-1}$) | T (C.) | k (min$^{-1}$) |
| (a) PISO2 | | | |
| 150 | 0.0016 | 126 | 0.0094 |
| 170 | 0.0065 | 146 | 0.014 |
| 200 | 0.032 | 166 | 0.063 |
| Ea = 23.9 kcal/mole | | Ea = 16.3 kcal/mole | |
| (b) m-PISO2 | | | |
| 150 | 0.027 | 148 | 0.63 |

It can be seen from Table 2 that microwaves clearly accelerate the reaction rate of PISO2 and m-PISO2 materials. For the PISO2 material, it is possible to perform an Arrhenius analysis on both sets of rate constants. The DSC data yield values of A=3.5×10$^9$ min$^{-1}$ and Ea=24 kcal/mole for the prefactor and activation energy, respectively. The microwave data, on the other hand, produce values of A=6.6×10$^6$ min$^{-1}$ and Ea=16 kcal/mole, respectively. The large difference in activation energy values indicates that a different reaction pathway is being followed in the two sets of experiments. Also, the much lower value of A which is observed indicates that a much "higher" local temperature is present in the microwave samples than in the DSC experiments.

EXAMPLE 2

Films of the polyamic acid reaction product (LARC-PAA) of 3,3',4 4'-benzophenone tetracarboxylic acid dianhydride (BTDA) and 3,3'-diaminobenzophenone (3,3'-DABP) were deposited on a substrate of maleimide terminated polycarbonate oligomer at a thickness of about 0.05 mm and were subjected to pulsed microwave radiation for 5 minutes at 130° C. Infrared spectra of the film samples were taken and the expanded 1450–1600 cm$^{-1}$ region of the spectrum of one of the samples is shown in FIG. 3. The spectrum shows that the peak for the amide carbonyl (bending motion) at about 1540 cm$^{-1}$ has almost completely disappeared. The peak at 1780 cm$^{-1}$ which corresponds to the phthalimide carbonyl stretching region, enlarges during the imidization reaction. This evidence shows that in the preparation of a film of LARC-PAA, essentially complete imidization occurs in a short period of time. After a carful examination the infrared samples do not show any trace of foaming or even bubble formation.

EXAMPLE 3

The polyamic acid produced from the reaction of BTDA and 3,3'-DABP, in the form of a solid piece of thicknes 1.3 mm, was placed into the single-mode microwave cavity and held isothermally at a temperature of 160 C. for 20 minutes. A non-foamed structure, which was completely reacted by infrared analysis, was produced at the end of this treatment. Using differential scanning calorimetry (DSC), the glass transition temperature of the final product was determined to be 250 C.

Having now fully described the invention, it will be apparent to one of ordinary skill in the art that many changes and modifications can be made thereto without departing from the spirit or scope of the invention as set forth herein.

What is claimed as new and desired to be secured by Letters Patent of the United States is:

1. A method of preparing a non-foamed intermolecular and/or intramolecular polyimide, comprising:
   (A) mixing an aromatic tetracarboxylic acid or a derivative thereof and an aromatic diamine so as to prepare a polyamic acid; and then
   (B) subjecting said polyamic acid in the solid phase in the absence of solvent to focused microwave radiation, thereby absorbing microwave power and forming said non-foamed polyimide product.

2. The method of claim 1, wherein said tetracarboxylic acid derivative is 3,3',4,4'-benzophenonetetracarboxylic acid dianhydride.

3. The method of claim 1, wherein said aromatic diamine is 3,3'-diaminobenzophenone, 3,3'-diaminodiphenylsulfone or 4,4'-diaminodiphenylsulfone.

4. The method of claim 1, wherein said polyamic acid at a thickness ranging from 0.01 mm to 5 mm is subjected to microwave radiation.

5. The method of claim 1, wherein said microwave radiation is applied from a single-mode microwave device having a cavity and having a power capacity of up to 40 watts.

6. The method of claim 1, wherein said microwave radiation is focused onto said polyimide at a frequency ranging from 10$^8$ to 10$^{11}$ Hz.

7. The method of claim 5, wherein step B is carried out at a temperature above about 100° C. and up to 250° C.

8. The method of claim 5, wherein the ratio of the power absorbed by the sample of polyamic acid in the cavity to the incident power is greater than 98%.

* * * * *